United States Patent [19]

Michel

[11] Patent Number: 5,396,112
[45] Date of Patent: Mar. 7, 1995

[54] DARLINGTON CIRCUIT HAVING MEANS FOR DETECTING A LINE INTERRUPTION IN ITS LOAD CIRCUIT

[75] Inventor: Hartmut Michel, Reutlingen, Germany

[73] Assignee: Robert Bosch GmbH, Stuttgart, Germany

[21] Appl. No.: 30,337

[22] PCT Filed: Aug. 21, 1991

[86] PCT No.: PCT/DE91/00666

§ 371 Date: Mar. 15, 1993

§ 102(e) Date: Mar. 15, 1993

[87] PCT Pub. No.: WO92/05635

PCT Pub. Date: Apr. 2, 1992

[30] Foreign Application Priority Data

Sep. 14, 1990 [DE] Germany .............. 40 29 169.9

[51] Int. Cl.⁶ ............................... H03K 17/615
[52] U.S. Cl. ............................ 327/545; 361/100; 327/575; 327/198
[58] Field of Search ............... 302/272.3, 255, 315, 302/270, 350, 364, 254, 580; 361/100, 101

[56] References Cited

U.S. PATENT DOCUMENTS

| | | | |
|---|---|---|---|
| 3,210,677 | 10/1965 | Hung Chang Lin et al. | 307/315 |
| 3,564,281 | 2/1971 | Tokunaga et al. | 307/254 |
| 4,142,113 | 2/1979 | Lundberg | 302/270 |
| 4,215,279 | 7/1980 | Lataire et al. | 307/270 |
| 4,564,771 | 1/1986 | Flohrs | 307/270 |
| 4,616,144 | 10/1986 | Hideshima et al. | 307/254 |
| 4,764,688 | 8/1988 | Matsumura | 307/270 |

Primary Examiner—Timothy P. Callahan
Assistant Examiner—Dinh T. Le
Attorney, Agent, or Firm—Kenyon & Kenyon

[57] ABSTRACT

A resistor (16) is connected in parallel with the base-emitter section of the power transistor (12) of a Darlington circuit (10-12) to detect a line interruption in its load circuit. Furthermore, circuit components (17) are provided, which are able to be controlled through the voltage dropping across the resistor (16) and which are able to be transformed into a second circuit state characterizing a line interruption when this voltage drops below a specifiable value. In this manner, through the application of a few simple and inexpensive components, a line interruption can be reliably detected in the load circuit without the use of a measuring resistor.

11 Claims, 1 Drawing Sheet

DARLINGTON CIRCUIT HAVING MEANS FOR DETECTING A LINE INTERRUPTION IN ITS LOAD CIRCUIT

FIELD OF THE INVENTION

The present invention relates to a Darlington circuit having means for detecting a line interruption in its load circuit.

BACKGROUND OF THE INVENTION

In the case of power transistors, particularly Darlington circuits, one often needs to be able to locate an interruption in the connections and lines in the load circuit so that appropriate counter-measures or auxiliary measures can be introduced. It is generally known to use a measuring resistor, which is traversed by the load current flow or by a portion of the same, for this purpose. To keep the power loss dissipation generated across the measuring resistor as low as possible, the measuring resistor, as a rule, has a very small resistance value, so that in a proper state, the rated current produces only a slight drop in voltage and a small power loss. Also, for those cases in which a very small portion of the primary current flows through the measuring resistor, often only a slight voltage drop is nevertheless required to ensure that the conditions in the main circuit and in the measuring circuit do not differ too greatly.

A device for recognizing such a line interruption must also function reliably in response to current values that lie far below the nominal value, often even by several orders of magnitude below this value. In this manner, the voltages to be evaluated become extremely small and the necessary measurement techniques become very complicated and expensive.

SUMMARY OF THE INVENTION

The present invention provides a Darlington circuit including at least one prior transistor connected to a power transistor. A resistor is connected between the base and the emitter of the power transistor. When the voltage drop across the resistor decreases below a preselected threshold voltage, a line interruption in the load circuit of the Darlington circuit is indicated.

The advantage of the Darlington circuit according to the present invention is that a line interruption in the load circuit is able to be detected with very little circuit expenditure and, thus, expense, and that no measuring resistor is needed in the load circuit or in a secondary branch of the same, so that, also, no power loss occurs. In spite of the simple design employing inexpensive component parts, which can also be integrated monolithically in a simple manner, line interruptions are able to be detected in a very precise manner.

In the simplest case, another transistor is provided as a circuit component, whose base is connected to the base of the power transistor of the Darlington circuit. The entire measuring device for detecting a line interruption consists, therefore, of one single transistor and one single resistor which only has to be rated for very low loads.

A simple and effective way to wire this additional transistor, which is designed in particular as an npn transistor, consists in connecting its emitter to the emitter of the power transistor of the Darlington circuit. The collector of this further transistor is advantageously loaded, thereby by a voltage source, whereby, given a proper state, the collector potential is lowered to the low level of the emitter potential ("LOW") without the presence of a line interruption. Thus, in the simplest possible manner, a line interruption can be detected by circuit means which respond to high potentials ("HIGH") at the base of the Darlington circuit and, simultaneously, at the collector of the other transistor.

The conditions are particularly favorable when at least an three-step Darlington circuit is used. Since it works with very low base currents, the resistor situated parallel to the base-emitter section of the power transistor of the Darlington circuit can have a higher resistance value.

Often circuit conditions exist in which a Darlington circuit is fed with base current via an upstream emitter follower. In such a case, a considerable base current could flow via the base-emitter section of the input transistor of the Darlington circuit, which in some instances would not permit the load interruption to be detected. To counteract this, an auxiliary transistor is expediently provided to lower the base current flowing to the base of the emitter follower toward the zero value when a line interruption exists. This auxiliary transistor is able to be controlled by the collector potential of the Darlington circuit. The lowering of this base current in the case of a line interruption enables the previously described arrangement to again become effective without restriction.

A favorable refinement in terms of a circuit arrangement can be achieved by wiring the contact-break distance of the auxiliary transistor between the base of the emitter follower and the emitter of the Darlington circuit. Expediently connected, in incoming circuit, to this auxiliary transistor is a pnp-series transistor, whose contact-break distance connects the emitter of the emitter follower to the base of the auxiliary transistor, and whose base is linked to the collector of the Darlington circuit. Two additional transistors are all that is required in this circuit arrangement to guarantee that a line interruption is properly detected, even when there is a series-connected emitter follower.

DETAILED DESCRIPTION

Figure 1:
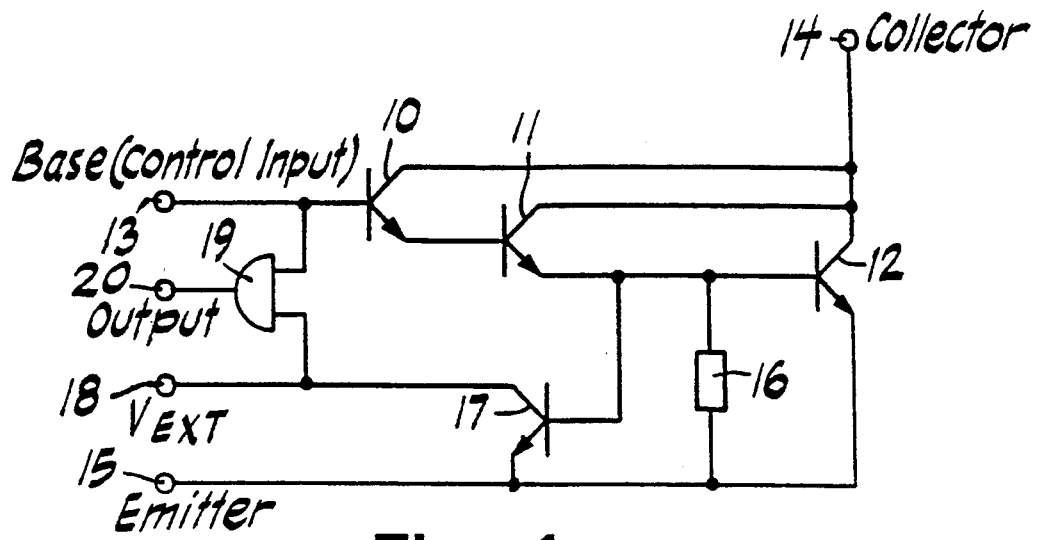
FIG. 1 shows a circuit diagram of a first exemplified embodiment according to the present invention with a three-step Darlington circuit.

In the first exemplified embodiment depicted in FIG. 1, a generally known three-step Darlington circuit consists of two prior transistors 10, 11 and one power transistor 12. The base of the first prior transistor 10 is connected to a base terminal (B) 13, while the collectors of all of the transistors 10-12 are connected to a collector terminal (C) 14. The transistors 10-12 are designed as npn transistors. In each case, the emitter of the first prior transistor 10 is connected to the base of the second prior transistor 11, and its emitter is connected to the base of the power transistor 12, while the emitter of the power transistor 12 is linked to an emitter terminal (E) 15.

To detect a line interruption, a resistor 16 and the base-emitter section of another transistor 17, which is designed as an npn transistor, are both connected in parallel to the base-emitter section of the power transistor 12. The collector of the additional transistor 17 is connected to a terminal 18, as well as to an input of an AND gate 19, whose second input is linked to the base of the first prior transistor 10. The output of the AND gate 19 is connected to an output terminal 20.

The mode of operation of the circuit depicted in FIG. 1 consists in that, in the normal case, i.e., when there is no line interruption in the load circuit and, thus, in the collector circuit of the Darlington circuit, a base current flows into the base of the first prior transistor 10 when the Darlington circuit is triggered, and releases an emitter current that is increased dependent upon the current amplification. This current flows, in turn, as a base current into the second prior transistor 11, and there, it releases an emitter current that has again been amplified. This divides into a first modulus that flows through the resistor 16 and produces a voltage drop use there, and into a second modulus that serves as the base current for the power transistor 12 and induces a current in the load circuit, which is again increased as a result of the current amplification. Parallel to this, the additional transistor 17 is controlled with current conduction, so that the potential from a voltage source (not shown) being applied to the connecting terminal 18 is lowered to the lower potential of the emitter, thus, to the so-called "LOW" potential. The emitter is generally connected to ground.

If the load circuit of the Darlington circuit is interrupted at this point, for example because of a defective line, a poor contact point, or a loosened terminal, then no more collector current flows to the prior transistors 10, 11, so that only the base current at the input of the first prior transistor 10 still flows there to the base of the power transistor 12, without amplification. As a result, the voltage drop across the resistor 16 becomes so slight that the transistors 12 and 17 remain blocked. For that reason, the higher potential of the voltage source (not depicted) is applied to the connecting terminal 18, with the result that the connecting terminal 18 exhibits the so-called "HIGH" potential. Since a correspondingly high potential is likewise applied to the base terminal 13, the AND gate 19 responds, and produces an output signal at the output terminal 20, signalling a line interruption. In a manner that is not depicted, this signal can release an optical or an acoustical signal, for example, or cause a corresponding error signal to be stored.

Of course, other logic components capable of diagnosing a corresponding signal combination can be used in place of the AND gate 19 as a means for detecting the error condition in the case of a line interruption. This AND gate 19 or a suitable subassembly can either form a monolithically integrated electric circuit, together with the remaining circuit, or it can be provided as an external component. It is also possible to link the connecting terminal 18 to a possibly already existing microcomputer to control the Darlington circuit, whereby the error detection would then take place in this microcomputer.

Of course, a two-step circuit, or a circuit having a still greater number of steps can take the place of the depicted three-step Darlington circuit. A greater number of steps proves to be favorable, because the high current amplification then makes it possible to select a resistor 16 having a higher resistance value.

Figure 2:
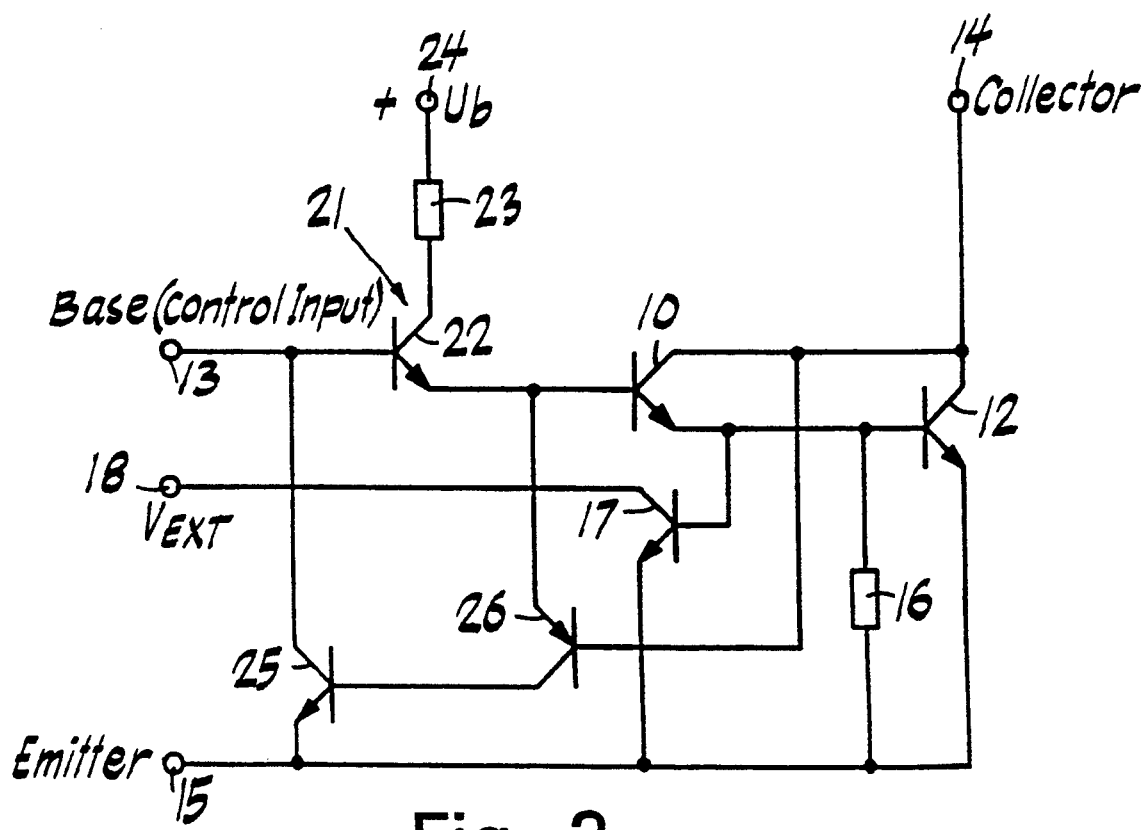
FIG. 2 shows a circuit diagram of a second exemplified embodiment according to the present invention including an emitter follower with an upstream two-step Darlington circuit.

In principle, the second exemplified embodiment depicted in FIG. 2 has the same design as the first exemplified embodiment depicted in FIG. 1 and described above, so that the same components or components having the same function are given the same reference symbols and are not described again.

The Darlington circuit is depicted in FIG. 2 as a two-step circuit, in which the second prior transistor 11 is dropped. Furthermore, connected in series with this Darlington circuit is an emitter follower 21, which consists of an npn transistor 22, whose base-emitter section is wired-up between the base terminal 13 and the base of the Darlington circuit 10, 12, and whose collector is linked via a collector resistor 23 to the positive pole 24 of a supply voltage source having the voltage $U_b$.

In addition, the base terminal 13 is connected to the emitter terminal 15 via the contact-break distance of an npn-auxiliary transistor 25, which has a pnp-series transistor 26 connected to it, in incoming circuit. The base of the pnp-series transistor 26 is linked to the collector of the Darlington circuit, and its contact-break distance connects the emitter of the emitter follower 21 to the base of the auxiliary transistor 25.

The AND gate 19 (not shown here) can, of course, likewise be provided for evaluation purposes. On the other hand, the evaluation can also be carried out by way of terminal 18 and an evaluation circuit (not shown) that is connected to it, or rather through an appropriately designed microcomputer. The evaluation conditions correspond to those of the first exemplified embodiment.

If an emitter follower 21 is connected in incoming circuit to a Darlington circuit 10, 12, as in the second exemplified embodiment, the resulting current traversing the base-emitter section of the power transistor 12, or rather the voltage drop across the resistor 16 can become so great, in spite of a line interruption, that the power transistor 12 and the other transistor 17 are powered-up. Then, one would not be able to detect a line interruption. To safely prevent this, transistors 25, 26 are provided. In case of a load interruption, the series transistor 26 is controlled with current conduction via the collector of the Darlington circuit and, in turn, controls the auxiliary transistor 25 with current conduction, so that the base current is lowered, or rather limited toward the zero value in the base of the emitter follower 21. As a result, conditions again prevail as described in the first exemplified embodiment. Therefore, in case of a line interruption, the other transistor 17 is reliably transformed (reset) into the blocking state.

I claim:
1. A circuit arrangement comprising:
    first circuit means including a prior transistor and a power transistor, with a base of the power transistor being connected to an emitter of the prior transistor, and with a collector of the power transistor being connected to a collector of the prior transistor for connection to a load circuit and with a base of the prior transistor being coupled to a control input;
    a resistor with a first terminal being connected to the base of the power transistor and a second terminal being connected to an emitter of the power transistor; and
    a load circuit interruption detector with a first input connected to the base of the power transistor and a second input connected to the control input, with an output voltage of the load circuit interruption detector switching from a first value to a second value when a voltage drop across the resistor decreases below a predetermined threshold voltage and while an input voltage is applied to the control input which would otherwise cause the power transistor to be in an on state if there were no interruption in the load circuit, thereby indicating a line interruption in the load circuit.

2. The circuit arrangement according to claim 1, wherein the load circuit interruption detector includes an addition transistor, with a base of the transistor being connected to the base of the power transistor, an emitter of the third transistor being connected to the emitter of the power transistor, and with a collector of the third transistor being coupled to an external voltage, so that the collector of the third transistor switches from the first voltage to the external voltage when the power transistor is in an off state.

3. The circuit arrangement according to claim 2, wherein the addition transistor is an npn transistor.

4. The circuit arrangement according to claim 1, wherein the second value is greater than the first value.

5. The circuit arrangement according to claim 2, wherein the first value is substantially equal to an emitter voltage of the addition transistor.

6. The circuit arrangement according to claim 2, wherein the load circuit interruption detector further includes an AND gate with a first input of the AND gate being connected to the control input and a second input of the AND gate being connected to the collector of the addition transistor and an output of the AND gate providing the output voltage.

7. The circuit arrangement according to claim 1, wherein the circuit arrangement further comprises a second prior transistor, wherein the prior transistor is coupled to the control input via the second prior transistor, with a base of the second prior transistor being connected to the control input, with an emitter of the second prior transistor being connected to the base of the prior transistor and a collector of the second prior transistor being connected to the collector of each of the prior transistor and the power transistor.

8. The circuit arrangement according to claim 1, wherein the circuit arrangement further comprises:

an emitter follower, by which the prior transistor is coupled to the control input, with an emitter of the emitter follower being connected to the base of the prior transistor and a base of the emitter follower being connected to the control input;

an auxiliary transistor, with an emitter of the auxiliary transistor being connected to the emitter of the power transistor, and a collector of the auxiliary transistor being connected to the base of the emitter follower for decreasing a current flow to the base of the emitter follower when the voltage drop across the resistor decreases below the predetermined threshold voltage; and a pnp transistor, with a base of the pnp transistor being connected to the collector of the prior transistor, an emitter of the pnp transistor being connected to the emitter of the emitter follower, and a collector of the pnp transistor being connected to a base of the auxiliary transistor.

9. The circuit arrangement according to claim 1, wherein the prior and power transistors are elements of a Darlington circuit.

10. The circuit arrangement according to claim 7, wherein the prior, second prior, and power transistors are elements of a Darlington circuit.

11. A method of detecting a line interruption in a load circuit connected to a collector of a power transistor connected with a prior transistor in a circuit arrangement, comprising the steps of:

(a) determining whether a voltage across a resistor connected between a base and an emitter of the power transistor falls below a predetermined threshold voltage;

(b) determining whether an input signal is being applied which would cause the power transistor to be in an on state if there were no interruption in the load circuit; and (c) switching an output voltage of a load circuit interruption detector having a first input coupled to the base of the power transistor, and a second input connected to the input signal from a first value to a second value when the determinations at steps a) and b) are both true, with the second value being indicative of a line interruption.

* * * * *

UNITED STATES PATENT AND TRADEMARK OFFICE
CERTIFICATE OF CORRECTION

PATENT NO. : 5,396,112
DATED : March 7, 1995
INVENTOR(S) : Hartmut Michel

It is certified that error appears in the above-indentified patent and that said Letters Patent is hereby corrected as shown below:

Column 3, line 19, "use" should be --$U_{BE}$--;

Column 5, lines 12, 13 and 15, "the third" should be --an addition--; and

Column 6, line 41, after "signal" insert ",".

Signed and Sealed this

Fifteenth Day of August, 1995

Attest:

BRUCE LEHMAN

Attesting Officer   Commissioner of Patents and Trademarks